United States Patent [19]

Kawajiri et al.

[11] Patent Number: 4,922,103
[45] Date of Patent: May 1, 1990

[54] RADIATION IMAGE READ-OUT APPARATUS

[75] Inventors: Kazuhiro Kawajiri; Hiroshi Sunagawa; Nobuharu Nozaki; Yuichi Hosoi; Kenji Takahashi, all of Kanagawa, Japan

[73] Assignee: Fuji Photo Film Co., Ltd., Kanagawa, Japan

[21] Appl. No.: 673,235

[22] Filed: Nov. 19, 1984

[30] Foreign Application Priority Data

Nov. 21, 1983 [JP] Japan ................. 58-219313

[51] Int. Cl.$^5$ ............................................. G03C 5/16
[52] U.S. Cl. ............................. 250/327.2; 250/484.1
[58] Field of Search ............. 250/327.2, 484.1, 370.07, 250/370.11; 378/146

[56] References Cited

U.S. PATENT DOCUMENTS

| Re. 31,847 | 3/1985 | Lucky | 250/327.2 |
|---|---|---|---|
| 3,544,713 | 12/1970 | Case et al. | 250/211 R |
| 4,179,100 | 12/1979 | Sashin et al. | 378/19 |
| 4,272,679 | 6/1981 | Blades | 250/372 |
| 4,284,889 | 8/1981 | Kato et al. | 250/355 |
| 4,400,619 | 8/1983 | Kotera et al. | 250/372.2 |
| 4,527,060 | 7/1985 | Suzuki et al. | 250/327.2 |

FOREIGN PATENT DOCUMENTS

| 0123942 | 11/1984 | European Pat. Off. | 250/327.2 |
|---|---|---|---|
| 0123943 | 11/1984 | European Pat. Off. | 250/327.2 |
| 56-27562 | 3/1981 | Japan . | |
| 58-84457 | 5/1983 | Japan . | |
| 58-121874 | 7/1983 | Japan | 250/327.2 |
| 2002956 | 2/1979 | United Kingdom . | |

OTHER PUBLICATIONS

S. P. Keller, "Storage Device Using Phosphors", IBM Tech. Disc. Bull., vol. 1, No. 1, Je 1958.

Primary Examiner—Janice A. Howell
Assistant Examiner—Richard Hanig
Attorney, Agent, or Firm—Sughrue, Mion, Zinn, Macpeak & Seas

[57] ABSTRACT

A radiation image read-out apparatus comprises a linear stimulating ray source for emitting stimulating rays to a linear portion of a stimulable phosphor sheet carrying a radiation image stored therein, and a line sensor constituted by many solid state photoelectric conversion devices. The line sensor extends at least over the length of the linear portion of the stimulable phosphor sheet exposed to stimulating rays. Light emitted by the linear portion of the stimulable phosphor sheet upon stimulation thereof is received and photoelectrically converted by the solid state photoelectric conversion devices. The portion exposed linearly to stimulating rays and the line sensor are moved with respect to the stimulable phosphor sheet, and outputs of the line sensor are sequentially read out in accordance with the movement of the portion exposed linearly to stimulating rays and the line sensor with respect to the stimulable phosphor sheet.

11 Claims, 3 Drawing Sheets

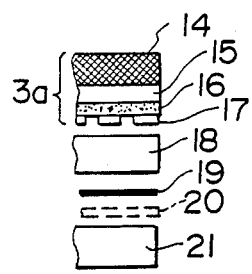
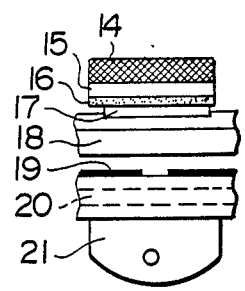
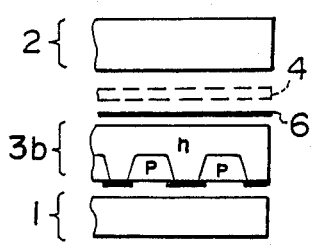
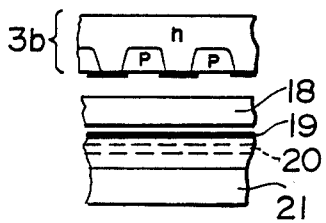
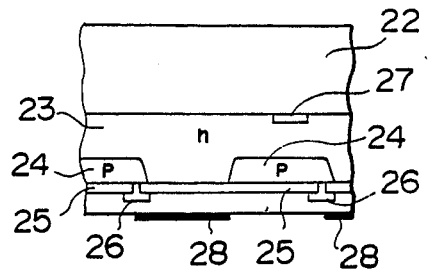
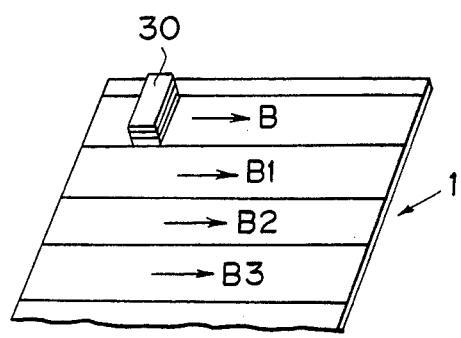

RADIATION IMAGE READ-OUT APPARATUS

BACKGROUND OF THE INVENTION

1. Field of the Invention

This invention relates to a radiation image read-out apparatus for exposing a stimulable phosphor carrying a radiation image stored therein to stimulating rays which cause the stimulable phosphor to emit light in proportion to the radiation energy stored, and detecting and converting the emitted light into an electric image signal. This invention particularly relates to a radiation image read-out apparatus using a light source linearly emitting stimulating rays and a line sensor comprising many solid state photoelectric conversion devices as a photodetector for receiving the light emitted by the stimulable phosphor and converting it into an electric image signal.

2. Description of the Prior Art

A novel radiation image recording and reproducing system is disclosed, for example, in U.S. Pat. No. 3,859,527. The system comprises (i) exposing a stimulable phosphor sheet to a radiation passing through an object such as the human body to have a radiation image stored therein, (ii) scanning the stimulable phosphor sheet by stimulating rays which cause it to emit light in proportion to the radiation energy stored, (iii) detecting the emitted light and converting it into an electric image signal by use of a photodetector, and (iv) reproducing a visible image by use of the electric image signal.

In the aforesaid radiation image recording and reproducing system, during image read-out a semi-transparent mirror is positioned at an angle of 45° with respect to the stimulable phosphor sheet, and stimulating rays are made to pass through the semi-transparent mirror from the back thereof and to impinge upon the stimulable phosphor sheet. Light emitted by the stimulable phosphor sheet in proportion to the stored radiation energy when it is exposed to stimulating rays is laterally reflected by the semi-transparent mirror and is received by an image intensifier tube or a photomultiplier. Alternatively, stimulating rays are emitted from the rear surface of the stimulable phosphor sheet via an aperture, and light emitted by the front surface of the stimulable phosphor sheet is laterally reflected by a prism and received by an image intensifier tube. However, since the semi-transparent mirror or the prism is positioned far away from to the stimulable phosphor sheet, it is not always possible to efficiently guide the light emitted by the stimulable phosphor sheet, which is non-directional and weak.

On the other hand, Japanese Unexamined Patent Publication No. 58(1983)-121874 discloses an X-ray image converter comprising a light sensor utilizing a photoconductive semiconductor instead of a photomultiplier or an image intensifier tube, the light sensor being overlaid on the whole surface of the stimulable phosphor sheet. The light sensor comprises two transparent electrodes, which may be divided into parallel strip-like portions, and the photoconductive semiconductor is sandwiched therebetween. Image read-out is conducted by scanning the stimulable phosphor sheet by stimulating rays made to impinge upon the sheet from the outside via the light sensor. Or, an array of light emitting diodes exhibiting a spectrum of stimulating rays are positioned over the whole surface of the light sensor, and the light emitting diodes are sequentially turned on to emit light for scanning the stimulable phosphor sheet. In the X-ray image converter, since the semiconductor layer is directly overlaid on the stimulable phosphor sheet, the possibility of a light receiving loss, i.e. of a loss of light emitted by the stimulable phosphor sheet in the space between the light receiving device and the stimulable phosphor sheet, is decreased. Therefore, it would be expected that the signal-to-noise ratio would increase.

However, actually, the aforesaid X-ray image converter has the drawbacks as described below.

(1) Since the light sensor is overlaid on the whole surface of the stimulable phosphor sheet, the photoconductive semiconductor is deteriorated when the stimulable phosphor sheet is subjected to noise erasing necessary for repeatedly using the stimulable phosphor sheet. (When the stimulable phosphor sheet is used repeatedly, radiation energy which remains on the stimulable phosphor sheet after the image read-out step and which constitutes noise in the next image recording and read-out is erased. Normally, noise erasing is conducted by exposing the stimulable phosphor sheet to a large amount of erasing light having a wavelength within the stimulating ray spectrum. Being exposed to the large amount of erasing light repeatedly, the semiconductor is deteriorated.) Also, since the weight and the volume of each stimulable phosphor sheet become large, the stimulable phosphor sheet becomes inconvenient for handling. Further, it is not always possible to actually overlay the light sensor on the whole surface of the stimulable phosphor sheet and to install the light emitting diode array over the whole surface thereof. Even when such a configuration can be realized, the cost of realizing the configuration is high.

(2) It is not always possible to obtain a photoconductive semiconductor exhibiting quick response characteristics. Therefore, it is not possible to increase the scanning speed of the stimulating rays (a light beam emitted by a stimulating ray source or light beams emitted by the light emitting diode array). Also, since the intensity of light emitted by a point light source such as the light emitting diode array is low, the exposure time at each portion of the stimulable phosphor sheet must be increased in order to cause it to emit light sufficiently. This also makes it impossible to increase the scanning speed.

(3) Even when the transparent electrodes are divided into parallel strip-like portions, the electrode area is still large. Therefore, a large dark current inevitably arises, and the capacitance is large. As a result, the signal-to-noise ratio cannot be improved so much.

SUMMARY OF THE INVENTION

The primary object of the present invention is to provide a radiation image read-out apparatus using solid state photoelectric conversion devices, which conducts image readout at a high speed and produces an electric image signal with a high signal-to-noise ratio.

Another object of the present invention is to provide a radiation image read-out apparatus which is easy to fabricate and handle and which can be made at a low cost.

The present invention provides a radiation image read-out apparatus comprising:

(i) a stimulating ray source for emitting stimulating rays linearly impinging upon a portion of a stimulable phosphor sheet carrying a radiation image stored therein, (ii) a line sensor comprising many solid state photoelectric conversion devices for receiving and photoelectrically converting light emitted by said stimulable phosphor sheet in proportion to the stored radiation energy when said stimulable phosphor sheet is exposed to the stimulating rays, said line sensor extending at least over the length of said portion of said stimulable phosphor sheet exposed linearly to the stimulating rays so as to stand face to face with said linearly exposed portion of said stimulable phosphor sheet, (iii) a scanning drive means for moving said portion exposed linearly to stimulating rays and said line sensor with respect to said stimulable phosphor sheet along the surface of said stimulable phosphor sheet, and (iv) a read-out means for sequentially reading out the outputs of said line sensor in accordance with the movement of said portion exposed linearly to stimulating rays and said line sensor with respect to said stimulable phosphor sheet.

In the radiation image read-out apparatus of the present invention, since no reflecting member such as a semi-transparent mirror or a prism need be used, it is possible to make the light receiving solid angle large. Therefore, it is possible to improve the signal-to-noise ratio. Also, since the solid state photoelectric conversion devices constituting the line sensor are divided in accordance with picture elements and have small areas, the dark current is small and the capacitance is small. Accordingly, it is possible to obtain a high signal-to-noise ratio.

Also, in the radiation image read-out apparatus of the present invention, since a plurality of picture elements are simultaneously exposed linearly to stimulating rays, it is possible to cause the stimulable phosphor sheet to emit light sufficiently even when a stimulating ray source emitting the stimulating rays of low intensity is used. Further, signals of picture elements are time-serially detected by use of an electric circuit, instead of scanning by a light spot. Therefore, it is possible to increase the read-out speed even when the read-out time per picture element is long.

Further, since the line sensor is separate from the stimulable phosphor sheet, the stimulable phosphor sheet is easy to handle, and noise erasing for repeatedly using the stimulable phosphor sheet can be conducted without deteriorating the photodetector. Also, since the sensor and the light source are markedly smaller than those in the apparatus of Japanese Unexamined Patent Publication No. 58(1983)-121874, the radiation image read-out apparatus of the present invention is easy to fabricate and can be made at a low cost.

In the radiation image read-out apparatus of the present invention, the stimulable phosphor sheet is linearly exposed to stimulating rays which are emitted by the stimulating ray source and which cause the stimulable phosphor sheet to emit light in proportion to the radiation energy stored. At the same time, the light emitted by the stimulable phosphor sheet is received by the line sensor. The line sensor comprises many solid state photoelectric conversion devices corresponding to respective picture elements and positioned at least over the length of the linearly exposed portion of the stimulable phosphor sheet. Upon receiving the light emitted by the stimulable phosphor sheet, the solid state photoelectric conversion devices convert the light into electric signals divided in accordance with the picture elements.

By reading out the electric signals by use of the read-out means, image information at the linearly exposed portion of the stimulable phosphor sheet is obtained. Thereafter, the portion exposed linearly to stimulating rays and the line sensor are moved relative to the stimulable phosphor sheet along the surface thereof, and the aforesaid read-out step is repeated. In this manner, the whole radiation image stored in the stimulable phosphor sheet is read out.

In this specification, it should be noted that "moving a portion exposed linearly to stimulating rays and a line sensor with respect to a stimulable phosphor sheet" means movement of the portion exposed linearly to stimulating rays and the line sensor relative to the stimulable phosphor sheet and includes both the movement of the portion exposed linearly to stimulating rays and the line sensor with the sheet standing still and the movement of the sheet with the portion exposed linearly to stimulating rays and the line sensor standing still.

As the stimulating ray source for emitting stimulating rays linearly impinging upon a portion of a stimulable phosphor sheet, it is possible to use, for example, an array of light emitting diodes or semiconductor lasers positioned for simultaneously emitting light, or a nondirectional light source comprising a fluorescent lamp, a xenon lamp, or the like and a slit or an aperture constituted by a row of small holes.

The line sensor is constituted by approximately linearly positioning the solid state photoelectric conversion devices such as photoconductive materials or photodiodes.

The line sensor should preferably have a length approximately equal to the length of the linearly exposed portion of the stimulable phosphor sheet, and is positioned in parallel with the linearly exposed portion of the sheet. The relationship $\lambda 1 > \lambda 2$ holds between the wavelength $\lambda 1$ of the stimulating rays and the wavelength $\lambda 2$ of the light emitted by the stimulable phosphor sheet. Therefore, depending on whether the band gaps of the solid state photoelectric conversion devices are larger or smaller than the energy of wavelength $\lambda 1$, the place at which the stimulating ray source can be positioned changes, and the configurations which the solid state photoelectric conversion devices can assume change. Specifically, when the band gaps of the solid state photoelectric conversion devices are larger than the energy of $\lambda 1$, the stimulating ray source may be positioned at the back of the line sensor and the stimulating rays may be made to impinge upon the stimulable phosphor sheet via the line sensor, or the stimulating ray source may be positioned on the back surface side of the stimulable phosphor sheet.

When the band gaps of the solid state photoelectric conversion devices are smaller than the energy of wavelength $\lambda 1$, the stimulating ray source is positioned on the back surface side of the stimulable phosphor sheet, and the line sensor is positioned on the front surface side of the stimulable phosphor sheet. Further, a long wave cut filter for cutting the stimulating rays should preferably be positioned between the line sensor and the stimulable phosphor sheet.

When the length of the line sensor is equal to the width of the stimulable phosphor sheet, the line sensor and the portion exposed linearly to stimulating rays are moved in the length direction of the stimulable phosphor sheet. When the length of the line sensor is shorter than the width of the stimulable phosphor sheet, the line sensor is positioned in the length direction of the stimulable phosphor sheet. In this case, the line sensor is first moved in the width direction of the stimulable phosphor sheet to scan the sheet in the width direction thereof. After scanning in the width direction is finished, the stimulable phosphor sheet is moved in the length direction thereof by a distance equal to the length of the linearly exposed portion thereof, and the aforesaid scanning in the width direction is repeated. In this manner, the whole surface of the stimulable phosphor sheet is scanned.

BRIEF DESCRIPTION OF THE DRAWINGS

FIGS. 5A and 5B are a sectional front view and a sectional side view showing a further embodiment of the radiation image read-out apparatus in accordance with the present invention, wherein a linear stimulating ray source is positioned on the back surface side of a stimulable phosphor sheet, FIGS. 6 and 7 are sectional views showing further embodiments of the radiation image read-out apparatus in accordance with the present invention, wherein photodiodes are used as the solid state photoelectric conversion devices, FIG. 8 is an enlarged sectional view showing the line sensor in FIGS. 6 and 7, and FIG. 9 is a perspective view showing a modified form of movement of the read-out system with respect to the stimulable phosphor sheet.

DESCRIPTION OF THE PREFERRED EMBODIMENTS

The present invention will hereinbelow be described in further detail with reference to the accompanying drawings.

Figure 1A:
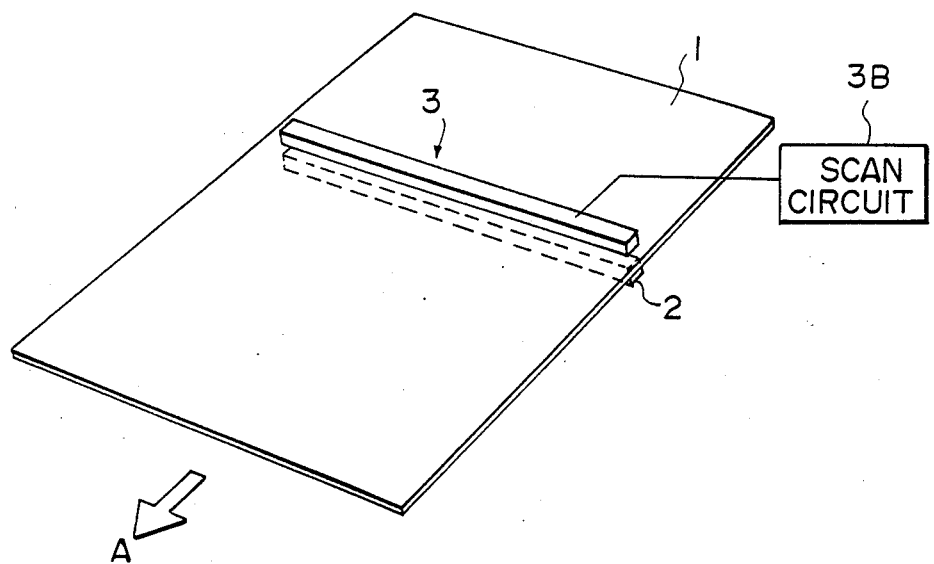
FIGS. 1A, 1B and 1C are a perspective view, a sectional front view, and a sectional side view showing an embodiment of the radiation image read-out apparatus in accordance with the present invention, wherein a linear stimulating ray source is positioned below a stimulable phosphor sheet and a line sensor is positioned above the stimulable phosphor sheet.
Figure 1B:
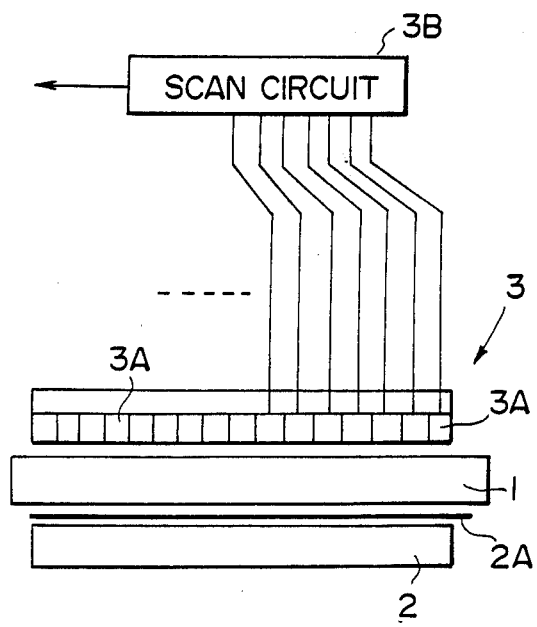
Figure 1C:
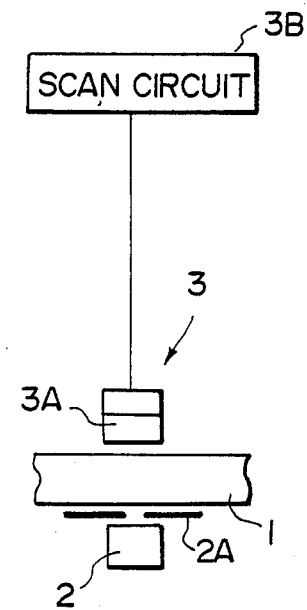

FIG. 1A is a perspective view showing an embodiment of the radiation image read-out apparatus in accordance with the present invention, wherein a linear stimulating ray source 2 is positioned below a stimulable phosphor sheet 1 carrying a radiation image stored therein and a line sensor 3 is positioned above the stimulable phosphor sheet 1. FIG. 1B is a sectional front view of FIG. 1, and FIG. 1C is a sectional side view of FIG. 1. As shown in detail in FIGS. 1B and 1C, the linear stimulating ray source 2 extending in the width direction of the stimulable phosphor sheet 1 is positioned under the stimulable phosphor sheet 1, and a slit member 2A having an elongated slit extending in the width direction of the stimulable phosphor sheet 1 is positioned between the linear stimulating ray source 2 and the stimulable phosphor sheet 1. The line sensor 3 is positioned above the stimulable phosphor sheet 1 so as to stand face to face with the slit in the slit member 2A. The line sensor 3 comprises many solid state photoelectric conversion devices 3A arrayed in the width direction of the stimulable phosphor sheet 1, and a scanning circuit 3B for transferring the charges accumulated in the solid state photoelectric conversion devices 3A.

The linear stimulating ray source 2 linearly emits stimulating rays onto the stimulable phosphor sheet 1 via the slit member 2A. The portion of the stimulable phosphor sheet 1 thus exposed linearly to stimulating rays emits light in proportion to the radiation energy stored therein. The light emitted by the linearly exposed portion of the stimulable phosphor sheet 1 is received by the solid state photoelectric conversion devices of the line sensor 3. Thus the devices 3A generate photocarriers and temporarily store signals obtained thereby. The stored signals are sequentially read out by the scanning circuit 3B, and read-out of one linear exposed portion (corresponding to one scanning line) of the stimulable phosphor sheet 1 is finished.

Then, the stimulable phosphor sheet 1 is moved with respect to the linear stimulating ray source 2 and the line sensor 3 by a distance equal to the spacing of one scanning line in the direction as indicated by the arrow A, and the aforesaid read-out step is repeated. The read-out operation is repeated over the whole surface of the stimulable phosphor sheet 1, and the radiation image stored in the whole surface of the sheet 1 is read out.

Figure 2:
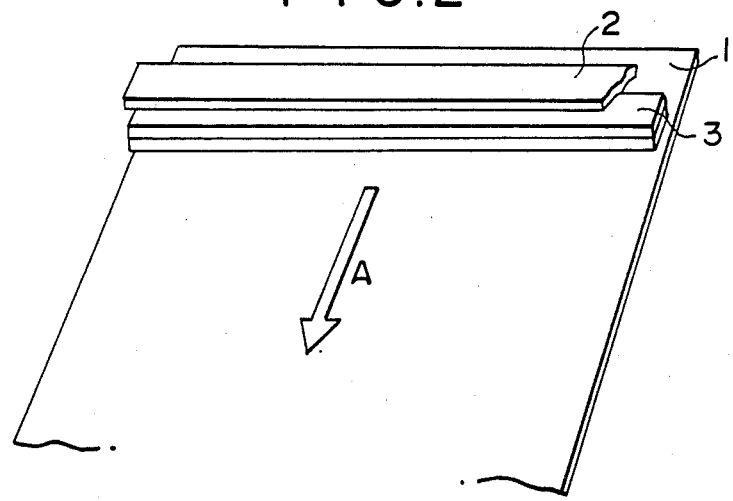
FIG. 2 is a perspective view showing another embodiment of the radiation image read-out apparatus in accordance with the present invention, wherein a line sensor is positioned above a stimulable phosphor sheet and a linear stimulating ray source is positioned at the back of the line sensor.
Figure 3A:
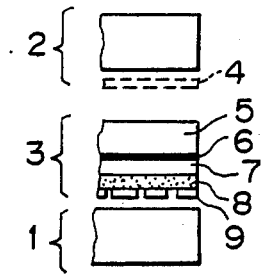
FIG. 3A is a sectional front view showing the line sensor and the linear stimulating ray source in the embodiment of FIG. 2.
Figure 3B:
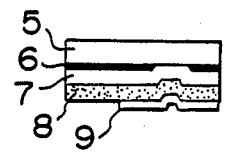
FIG. 3B is a sectional side view showing the line sensor in the embodiment of FIG. 2.

FIG. 2 is a perspective view showing another embodiment of the radiation image read-out apparatus in accordance with the present invention, wherein the linear stimulating ray source 2 is positioned at the back of the line sensor 3 on the same side of the stimulable phosphor sheet 1. FIG. 3A is a partial sectional front view showing the linear stimulating ray source 2 and the line sensor 3 in the embodiment of FIG. 2, and FIG. 3B is a sectional side view showing the line sensor 3. The line sensor 3 uses thin layer photoconductors and is fabricated by stacking a light shielding layer 6 provided with a slit or a series of small holes, a transparent electrode layer 7, a photoconductor layer 8, and a transparent electrode layer 9 on a transparent substrate 5. By dividing the transparent electrode layer 7 and/or the transparent electrode layer 9 in accordance with picture elements, many solid state photoelectric conversion devices corresponding to the picture elements are formed in the stack. In FIG. 3A, the transparent electrode layer 9 is divided in accordance with the picture elements.

The stimulable phosphor sheet 1 carrying a radiation image stored therein is linearly exposed to stimulating rays emitted by the linear stimulating ray source 2 via the line sensor 3, i.e. via the transparent substrate 5, the slit or series of small holes in the light shielding layer 6, the transparent electrode layer 7, the photoconductor layer 8, and the transparent electrode layer 9. Light emitted by the stimulable phosphor sheet 1 in proportion to the stored radiation energy when it is exposed to stimulating rays is received by the photoconductor layer 8 via the transparent electrode layer 9. The photoconductor layer 8 is constituted by a photoconductor exhibiting an energy gap Eg larger than the energy $hc/\lambda 1$ ($=h\nu 1$) of the stimulating rays and smaller than the energy $hc/\lambda 2$ ($=h\nu 2$) of the light emitted by the stimulable phosphor sheet 1. For example, it is possible to constitute the photoconductor layer 8 by using ZnS, ZnSe, CdS, $TiO_2$, ZnO, or the like when rare earth activated alkaline earth metal fluorohalide phosphor as disclosed in U.S. Pat. No. 4,239,968 is used as the stimulable phosphor.

When the stimulating rays contain a short wave component, a short wave cut filter 4 is inserted between the linear stimulating ray source 2 and the line sensor 3, thereby passing only a long wave component. The transparent electrode layer 9 (constituted, e.g. by ITO) is divided into very small units in the longitudinal direction of the line sensor 3. The potential difference arising between one divided unit of the transparent electrode layer 9 and the transparent electrode layer 7, i.e. the potential difference generated by accumulation of signals caused by photocarriers generated upon receiving of the light emitted by the stimulable phosphor sheet 1 within the photoconductor layer 8 between the transparent electrode layers 7 and 9, corresponds to an image signal of one pixel (picture element). The signals caused by photocarriers, which are obtained at the divided electrode units are time-serially read out by use of a shift register. In this manner, image signals of one scanning line are obtained. Then, the aforesaid operation is repeated each time the linear stimulating ray source 2 and the line sensor 3 are moved by a distance corresponding to the spacing of one scanning line in the direction as indicated by the arrow A. Thus the radiation image over the whole surface of the stimulable phosphor sheet 1 is read out as time-serial image signals.

Figure 4:
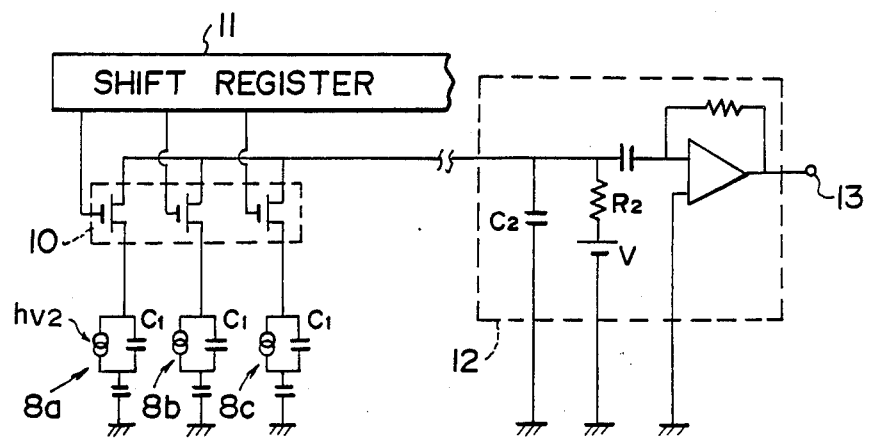
FIG. 4 is an equivalent circuit diagram showing a line sensor using photoconductors and a scanning circuit.

A scanning circuit following the line sensor 3 will be described hereinbelow. FIG. 4 is an equivalent circuit diagram showing a line sensor and a scanning circuit. Signals caused by photocarriers generated when light (h$\nu$2) emitted by a stimulable phosphor sheet impinges upon solid state photoelectric conversion devices 8a, 8b, and 8c using a photoconductor are accumulated at capacitors C1, C1, C1 of the solid state photoelectric conversion devices 8a, 8b, and 8c. The accumulated signals of the photocarriers are sequentially read out by switching of a switch section 10 carried out by a shift register 11, and time-serial image signals are obtained thereby. The image signals are then amplified by an amplifier 12 and are sent out from an output terminal 13 of the amplifier 12.

The MOS section comprising the switch section 10 and the shift register 11 may be replaced by a charge coupled device (CCD).

FIGS. 5A and 5B are partial sectional front view and a sectional side view showing configurations of a linear stimulating ray source and a line sensor in a further embodiment of the radiation image read-out apparatus in accordance with the present invention, which provides approximately the same effects as those in the aforesaid embodiments. Stimulating rays emitted by a linear stimulating ray source 21 are made to impinge upon the back surface of a stimulable phosphor sheet 18 via a slit or small holes of a light shielding layer 19. Light emitted by the stimulable phosphor sheet 18 when it is exposed to the stimulating rays is received by a line sensor 3a positioned on the front surface side of the sheet 18 so as to stand face to face with the linear stimulating ray source 21. The line sensor 3a is fabricated by stacking an electrode layer 15, a photoconductor layer 16, and a divided transparent electrode layer 17 on a light shielding substrate 14. When the stimulating rays contain a short wave component, a short wave cut filter 20 is inserted between the linear stimulating ray source 21 and the stimulable phosphor sheet 18, thereby passing only a long wave component. In this embodiment, since the stimulating rays do not pass through the photoconductor layer 16, it is possible to use a photoconductor fabricated of, for example, amorphous SiH, CdS(Cu), ZnS(Al), CdSe, or PbO, which exhibits an energy gap Eg smaller than the energy hc/$\lambda$1 of the stimulating rays. However, in this case, it is necessary to position a long wave cut filter between the line sensor 3a and the stimulable phosphor sheet 18 so that stimulating rays leaking from the surface of the sheet 18 do not impinge upon the line sensor 3a.

In the aforesaid embodiment, photoconductors are used as the solid state photoelectric conversion devices. However, it is also possible to use photodiodes instead of the photoconductors.

FIG. 6 is a sectional view showing a still further embodiment of the radiation image read-out apparatus in accordance with the present invention, wherein the linear stimulating ray source 2 is positioned at the back of a line sensor 3b comprising photodiodes and stimulating rays are made to impinge upon the stimulable phosphor sheet 1 via the line sensor 3b. FIG. 7 is a sectional view showing another embodiment of the radiation image read-out apparatus in accordance with the present invention, wherein the linear stimulating ray source 21 is positioned on the back surface side of the stimulable phosphor sheet 18 and the line sensor 3b comprising photodiodes is positioned on the front surface side of the stimulable phosphor sheet 18. The embodiment of FIG. 6 corresponds to the embodiment of FIG. 3A, and the embodiment of FIG. 7 corresponds to the embodiment of FIG. 5A. Therefore, in FIGS. 6 and 7, similar elements are numbered with the same reference numerals with respect to FIGS. 3A and 5A.

FIG. 8 is an enlarged sectional view showing the configuration of the line sensor 3b in the embodiment of FIGS. 6 and 7. The line sensor 3b is fabricated by stacking an n-layer 23 and a divided p-layer 24 on a crystal substrate 22, thereby forming a photodiode array. A transparent insulation layer 25 made of phosphors silicate glass, or the like, and a light shielding layer 28 provided with a slit or small holes are overlaid on the diode layers 23 and 24. An electrode 27 is positioned adjacent the n-layer 23, and the other electrode 26 is positioned adjacent the p-layer 24. The electrode 26 is fabricated of aluminium or the like.

When photodiodes fabricated of ZnS, ZnSe, or the like, which exhibit an energy gap Eg larger than the energy hc/$\lambda$1 of the stimulating rays are used as the solid state photoelectric conversion devices, both embodiments of FIGS. 6 and 7 are applicable. When photodiodes fabricated of Si, GaP, amorphous silicon, or the like, which exhibit an energy gap Eg smaller than the energy hc/$\lambda$1 of the stimulating rays are used as the solid state photoelectric conversion devices, only the embodiment of FIG. 7 is applicable.

As the method of guiding the light emitted by the stimulable phosphor sheet to the solid state photoelectric conversion devices, the line sensor should most preferably be closely contacted with the stimulable phosphor sheet. However, it is also possible to position a micro-lens array or optical fibers in the form of a flat cable between the line sensor and the stimulable phosphor sheet, thereby guiding the light emitted at each pixel to each solid state photoelectric conversion device of the line sensor in one-to-one relation.

In the aforesaid embodiments, the read-out system comprising the linear stimulating ray source and the line sensor is extended in the width direction of the stimulable phosphor sheet, and is moved with respect to the stimulable phosphor sheet in the length direction of the sheet, as shown in FIGS. 1A and 2. However, as shown in FIG. 9, it is also possible to use a read-out system 30 comprising a relatively short line sensor and a relatively short linear stimulating ray source so that the read-out system 30 extends in the length direction of the stimulable phosphor sheet 1. In this case, the read-out system 30 is moved in the width direction of the sheet 1 as indicated by the arrow B and is then shifted in the length direction of the sheet 1, thereby scanning in the directions of B1, B2, . . .

We claim:

1. A radiation image read-out apparatus comprising:
   (i) a stimulating ray source for emitting stimulating rays linearly impinging upon a portion of a stimulable phosphor sheet carrying a radiation image stored therein by stored radiation energy, said stimulating ray source being positioned on a first side of said stimulable phosphor sheet,
   (ii) a line sensor comprising many solid state photoelectric conversion devices for receiving and photoelectrically converting light emitted by said radiation image stored in said stimulable phosphor sheet in proportion to said stored radiation energy when said stimulable phosphor sheet is exposed to the stimulating rays, said line sensor being positioned on a second side of said stimulable phosphor sheet opposite said stimulating ray source such that said stimuable phosphor sheet is positioned between said stimulating ray source and said line sensor, said line sensor extending at least over the length of said portion of said stimulable phosphor sheet exposed linearly to the stimulating rays so as to stand face to face with said linearly exposed portion of said stimulable phosphor sheet,
   (iii) scanning drive means for moving said portion exposed linearly to stimulating rays and said line sensor with respect to said stimulable phosphor sheet along the surface of said stimulable phosphor sheet, and
   (iv) read-out means for sequentially reading out the outputs of said line sensor in accordance with the movement of said portion exposed linearly to stimulating rays and said line sensor with respect to said stimulable phosphor sheet.

2. An apparatus as defined in claim 1 wherein signals caused by photocarriers generated on the basis of the light, which is emitted by said stimulable phosphor sheet and received by said solid state photoelectric conversion devices, are temporarily accumulated and then read out by use of said solid state photoelectric conversion devices and said read-out means.

3. An apparatus as defined in claim 2 wherein said line sensor has a length approximately equal to the width of said stimulable phosphor sheet and is positioned in the width direction of said stimulable phosphor sheet, and said scanning drive means moves said line sensor in the length direction of said stimulable phosphor sheet.

4. An apparatus as defined in claim 1 wherein said line sensor has a length approximately equal to the width of said stimulable phosphor sheet and is positioned in the width direction of said stimulable phosphor sheet, and said scanning drive means moves said line sensor in the length direction of said stimulable phosphor sheet.

5. An apparatus as defined in claim 4 wherein said line sensor is comprised of a light shielding layer provided with a slit or small holes, a first transparent electrode layer, a photoconductor layer, and a second transparent electrode layer disposed on a transparent substrate in this order, and at least one of said first transparent electrode layer and said second transparent electrode layer is divided into sections each corresponding to one picture element.

6. An apparatus as defined in any of claims 1 to 4 wherein said line sensor is comprised of a first transparent electrode layer, a photoconductor layer, and a second transparent electrode layer disposed on a light shielding substrate in this order, and at least one of said first transparent electrode layer and said second transparent electrode layer is divided into sections each corresponding to one picture element.

7. An apparatus as defined in any of claims 1 to 4 wherein said line sensor is comprised of an n-layer, a divided p-layer, a transparent insulation layer, and a light shielding layer provided with a slit or small holes disposed on a crystal substrate to form a photodiode array in this order, a first electrode is positioned adjacent said n-layer, and a second electrode is positioned adjacent said p-layer.

8. A radiation image read-out apparatus comprising:
   (i) a stimulating ray source for emitting stimulating rays linearly impinging upon a portion of a stimulable phosphor sheet carrying a radiation image stored therein by stored radiation energy, said stimulating ray source being positioned on a first side of said stimulable phosphor sheet,
   (ii) a substantially transparent line sensor comprising many solid state photoelectric conversion devices for receiving and photoelectrically converting light emitted by said radiation image stored in said stimulable phosphor sheet in proportion to said stored radiation energy when said stimulable phosphor sheet is exposed to the stimulating rays, said line sensor being positioned on said first side of said stimulable phosphor sheet such that said line sensor is positioned between said stimulable phosphor sheet and said stimulating ray source, said line sensor extending at least over the length of said portion of said stimuable phosphor sheet exposed linearly to the stimulating rays by said stimulating ray source through said line sensor so that said line sensor stands face to face with said linearly exposed portion of said stimulable phosphor sheet,
   (iii) scanning drive means for moving said portion exposed linearly to stimulating rays and said line sensor with respect to said stimulable phosphor sheet along the surface of said stimulable phosphor sheet, and
   (iv) read-out means for sequentially reading out the outputs of said line sensor in accordance with the movement of said portion exposed linearly to stimulating rays and said line sensor with respect to said stimulable phosphor sheet, wherein
   (v) the photoelectric conversion devices comprise a photoconductor exhibiting an energy gap larger than the energy of the stimulating rays and smaller than the energy of the light enitted by the radiation image stored in the stimulable phosphor sheet, and wherein the stimulating rays have a wavelength different from that of the light emitted by the radiation image stored in the stimulable phosphor sheet, said energy gap being in a range from 2.0 to 2.7 ev.

9. An apparatus as defined in claim 8 wherein signals caused by photocarriers generated on the basis of the light, which is emitted by said stimulable phosphor sheet and received by said solid state photoelectric conversion devices, are temporarily accumulated and then read out by use of said solid state photoelectric conversion devices and said read-out means.

10. An apparatus as defined in claim 9 wherein said line sensor has a length approximately equal to the width of said stimulable phosphor sheet and is positioned in the width direction of said stimulable phosphor sheet, and said scanning drive means moves said line sensor in the length direction of said stimulable phosphor sheet.

11. An apparatus as defined in claim 8 wherein said line sensor has a length approximately equal to the width of said stimulable phosphor sheet and is positioned in the width direction of said stimulable phosphor sheet, and said scanning drive means moves said line sensor in the length direction of said stimulable phosphor sheet.

* * * * *